(12) United States Patent
Zettler

(10) Patent No.: US 7,283,218 B2
(45) Date of Patent: Oct. 16, 2007

(54) METHOD AND APPARATUS FOR THE DETERMINATION OF CHARACTERISTIC LAYER PARAMETERS AT HIGH TEMPERATURES

(75) Inventor: Jörg-Thomas Zettler, Berlin (DE)

(73) Assignee: Laytec Gesellschaft Für In-Situ und Nano-Sensorik mbH, Berlin (DE)

( * ) Notice: Subject to any disclaimer, the term of this patent is extended or adjusted under 35 U.S.C. 154(b) by 480 days.

(21) Appl. No.: 10/733,252

(22) Filed: Dec. 12, 2003

(65) Prior Publication Data
US 2004/0263867 A1    Dec. 30, 2004

(30) Foreign Application Priority Data
Dec. 12, 2002   (DE)  ................................ 102 58 713

(51) Int. Cl.
*G01J 5/48* (2006.01)
(52) U.S. Cl. ........................................... 356/43
(58) Field of Classification Search ................. 356/43, 356/630, 369, 237.1, 237.2; 374/1, 137, 374/142; 250/225, 255
See application file for complete search history.

(56) References Cited

U.S. PATENT DOCUMENTS

| | | | |
|---|---|---|---|
| 4,919,542 A | | 4/1990 | Nulman et al. |
| 5,029,117 A | | 7/1991 | Patton |
| 5,501,637 A | * | 3/1996 | Duncan et al. ............. 374/126 |
| 6,362,881 B1 | * | 3/2002 | Pickering et al. ........... 356/369 |
| 6,608,689 B1 | * | 8/2003 | Wei et al. ................... 356/630 |
| 6,679,946 B1 | * | 1/2004 | Jackson et al. .............. 117/84 |
| 6,781,692 B1 | * | 8/2004 | Rosencwaig ................ 356/369 |
| 2002/0113971 A1 | | 8/2002 | Zettler et al. |

FOREIGN PATENT DOCUMENTS

| | | |
|---|---|---|
| DE | 44 19 476 A1 | 12/1994 |
| DE | 100 61 168 A1 | 6/2002 |
| WO | WO 02/26435 A1 * | 4/2002 |
| WO | WO-02/26435 A1 | 4/2002 |

\* cited by examiner

*Primary Examiner*—Roy M. Punnoose
(74) *Attorney, Agent, or Firm*—Birch, Stewart, Kolasch & Birch, LLP

(57) ABSTRACT

A method for the determination of characteristic layer parameters by means of spectral-optical measurements, that allow for precise measurements of the sample temperature even under the conditions of industrial growth processes and furthermore avoids the detection of thermal radiation and reflected radiation by means of twofold phase sensitive frequency modulation by using so called chopper and lock-in amplifier respectively. The wobbling and/or rotating of the sample to be measured is compensated and/or the pyrometer optical path and the optical path of the spectral-optical system are guided separately of each other and/or a separation of the radiation signal for the temperature measurement and the radiation signal for the spectral-optical measurement is implemented by blanking of the irradiated light.

16 Claims, 5 Drawing Sheets

METHOD AND APPARATUS FOR THE DETERMINATION OF CHARACTERISTIC LAYER PARAMETERS AT HIGH TEMPERATURES

This nonprovisional application claims priority under 35 U.S.C. § 119 (a) on patent application No(s). 102 58 713.2 filed in Germany on Dec. 12, 2002, the entire contents of which are hereby incorporated by reference.

BACKGROUND OF THE INVENTION

1. Field of the Invention

The invention relates to a method and an apparatus for the determination of characteristic layer parameters during the coating process by means of spectral-optical measurements.

2. Discussion of the Background

Measurements of layer thickness belong to the most important tools during quality control in the semiconductor production. Recently these measurements are not only carried out for quality assurance after the process steps, but also through real-time measurements during the coating processes. In this respect different spectroscopic-optical real-time processes are known.

Within these processes light is suitably irradiated on to the layer stack to be investigated and then measured either in reflection or in transmission. Typical measurement methods using perpendicular incidence of light are: transmission-spectroscopy and reflectance-anisotropy-spectroscopy (RAS). Typical measurement methods using oblique incidence of light are: ellipsometry and polarisation dependent photometry. The here produced change of the light intensity or the light phase caused by the layer structure is measured. This change of the light intensity or of the light phase can be described by physical laws and thus is an unequivocal function of the layer parameters, i.e. the layer thickness and the material used (Born/Wolf, Principles of Optics). By inversion of the arguments the single layer parameter can be determined using this functional dependence. As there is a non-linear dependence between the change in light intensity/light phase and the layer parameters, the mathematical determination is not performed by analytical calculations but by numerical program-algorithms as for example Marquardt-Levenberg, Simplex after Nelder & Meat (Numerical Recipes in C).

It is furthermore known, that the properties of all known layer materials (refraction index n, absorption index k) change with the wavelength of the light as well as in dependence of temperature. Therefore for high temperature processes, as for example a coating procedure, it is necessary to know exactly the temperature of the substrate to be coated (subsequently called sample) in order to analyse the spectroscopic-optical real-time measurement in a correct way. One possibility is to determine numerically the temperature because of the mathematical dependence from the changes in light intensity/light phase as well as an additional fit parameter. By doing that the sample temperature can be determined only with a precision of ±10 K. Unfavourable is, that also the precision of the characteristic layer parameter (for example the layer thickness) is strongly limited because of the mathematical implications.

For a more exact determination of the sample temperature and thereby of the layer parameters the use of pyrometers is known, because a direct temperature measurement, for example by using calibrated platinum resistance or other contact thermometer, as thermocouples, is not possible during a coating process.

As the thermal radiation that is measured in the pyrometer interferes at the growing layer, the measured radiation intensity depends not only on the temperature but also on the layer thickness. This leads to the fact, that the pyrometer signal oscillates during the coating process because of the changing layer thickness, even if the true temperature stays constant. However, this pyrometer signal can be corrected with respect to the emissivity of the sample, as known from DE 44 19 476 C2. Therefore suitable monochromatic light is irradiated on to a sample and from the reflected part the reflectance is determined. From this the emissivity $\epsilon_P$ of the sample is calculated according to known physical laws (it is assumed that the substrate to be coated is not transparent for the pyrometer wavelength). From the gained measuring data the absolute sample temperature can be determined with an accuracy of temperature measurement of ±1 K and better.

Only by this exact determination of the absolute temperature of the sample the selected layer parameters can be determined with an high accuracy by analysis of the reflected light.

However, using the method proposed in DE 44 19 476 C2 it is unfavourable that the superposed signals from thermal radiation and reflected radiation have to be separated in a complex manner before they can be measured and analysed. This detection of thermal radiation and reflected radiation that has necessarily to be performed separately is carried out in DE 44 19 476 C2 by a complex arrangement by means of twofold phase sensitive frequency modulation using so called chopper and lock-in amplifier. Because of this two-fold modulation typical it is not possible to measure exactly industrial applications, which depend on a high resolution in time (as for example fast rotating samples in multi wafer reactors) because it is impossible to distinguish between sample carrier and sample due to the inevitably reduced resolution in time of the detection system. For this reason in WO 02/26435 A1 an arrangement was proposed, where a distinction between sample temperature and sample carrier temperature becomes possible by using a combination of several pyrometers. However, the simultaneous use of several pyrometers is a very complex and cost intensive solution as well.

Furthermore for all solutions proposed for the measurement of the sample temperature, it is disadvantageous that the emissivity of the sample, which influences the pyrometer signal, cannot be measured exactly under industrial conditions (rotating wobbling samples). This might possibly lead to an inaccurate measurement of the sample temperature along with an inaccurate determination of the characteristic layer parameters.

SUMMARY OF THE INVENTION

Therefore it is the object of the invention to provide a method for the determination of characteristic layer parameters by means of spectral-optical measurements, that allow for precise measurements of the sample temperature even under the conditions of industrial growth processes, i.e. wobbling samples and/or fast changes between sample carrier and sample and furthermore avoids the detection of thermal radiation and reflected radiation by means of two-fold phase sensitive frequency modulation by using so called chopper and lock-in amplifier respectively. Thereby a simultaneous or nearly simultaneous measurement of the absolute temperature of the layer sample as well as at least one additional spectroscopic-optical measuring value should become possible easily in order to realize real-time determination of characteristic values of the layer system (for example layer thickness in high temperature processes). Furthermore an apparatus for the realization of the method in the spirit of the invention shall be specified.

A special advantage is given by the fact, that for the spectral-optical measurement with the method in the spirit of the invention a higher precision as well as a higher rate can be achieved.

Therefore the wobbling and/or rotation of the sample to be measured is compensated and/or the pyrometer optical path and the optical path of the spectral-optical system are separately guided and/or a separation of the radiation signal for the temperature measurement and the radiation signal of the spectral-optical measurement is implemented by blanking of the irradiated light. A separation of the optical paths can be achieved in such a way, that the pyrometric measurement is performed through an optical path separated from the path of the spectral-optical measurement, whereby the angle of detection (with respect to the sample perpendicular) of the pyrometer is identical to the angle of incidence of the spectral-optical measurement.

By acting like that advantageously the complex separation of temperature-signal and reflection-signal by double phase modulation can be omitted.

As the optical path of the spectral-optical system and the optical path of the pyrometer are separately guided in a suitable way or as the signal separation is realized by a blanking synchronised to the coating process, the critical frequency of the used pyrometer-detector is the limiting parameter for the achievable resolution in time of the measurement, and not the modulation frequency of the light source or the detection channel.

An additional advantage of the invention is given by the fact, that the temperature signal to be measured at the pyrometer is not emissivity-distorted, because the measurement of the reflection coefficient under industrial conditions can be carried out more precisely in comparison to the state of the art due to the wobbling/rotating correction.

The compensation of wobbling and/or rotating of the sample to be measured under oblique incidence of light is preferably carried out by using a spherical mirror, whereat the sample is located in the centre of the curvature of the spherical mirror. For perpendicular incidence of light the compensation of the wobbling and/or rotating of the sample to be measured is preferably carried out by a lens, a beam splitter and an aperture.

The blanking of the irradiated light is preferably synchronised with respect to the spectral-optical measurement and can be realised by a shutter.

In the case that a sample is arranged on a sample carrier synchronisation of the blanking shall preferably be made with respect to the rotation of the sample carrier.

In a preferred embodiment additionally a measurement of the radial temperature profile of the sample carrier shall be carried out.

In case of reflectance anisotropy spectroscopy a separate detection of the pyrometer signal and the spectral-optical signal can preferably be implemented by the construction of the analyser-prisms as beam splitting polarization prism. Thereby the detection angle of the pyrometer with respect to the line perpendicular to the will be identically equal to the angle of incidence of the spectral-optical measurement with respect to the sample perpendicular.

The calculation of the effective emissivity $<\epsilon>$ of a sample can be carried out with the aid of an anti-wobbling-mirror according to the formula:

$$<\epsilon>=(1-R_P)*(1+R_{ATS}*R_P)=\epsilon_P*(1+R_{ATS}*R_P)$$

where $R_P$ is the reflectance of the sample, $R_{ATS}$ the reflectance of the anti-wobbling-mirror and $\epsilon_P$ the emissivity of an absorbing sample without anti-wobbling optics.

The calculation of the effective emissivity $<\epsilon>$ of a transparent sample for transmissive measurement can be carried out according to the formula:

$$<\epsilon>=\epsilon_{PT}*T_P*(1+R_{ATS}*R_P+R_{ATS}*T_P^2*R_{PT})$$

where $T_P$ is the transmission coefficient of the sample, $R_P$ is the reflectance of the sample, $R_{ATS}$ the reflectance of the anti-wobbling-mirror, $R_{PT}$ the reflectance of the sample carrier and $\epsilon_{PT}$ the emissivity of the sample carrier.

Furthermore it is intended according to the invention, that the spectral-optical measurement can be carried out using the special case of only one wavelength.

The apparatus for the realisation of the method in the spirit of the invention comprises means for compensation of the wobbling and/or rotating of the sample and/or means for blanking of the irradiated light and/or an optical path for the spectral-optical measurement, that is separated from the pyrometer optical path.

The means for blanking of the irradiated light preferably is a shutter. The means for compensation of the wobbling and/or rotating of the sample at oblique incidence of light is preferably a spherical mirror, whereat the sample is adjusted in the centre of the curvature of the spherical mirror. The means for compensation of the wobbling and/or rotating of the sample for perpendicular incidence of light preferably comprises a lens, a beam splitter and an aperture.

Furthermore in an additional embodiment the apparatus in the spirit of the invention may comprise several pyrometers, which are arranged in different distances from the centre of the rotating sample carrier.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein.

In the following the invention shall be explained with the help of examples for the embodiments that are at least partly shown in the figures.

DESCRIPTION OF THE PREFERRED EMBODIMENTS

Figure 1:
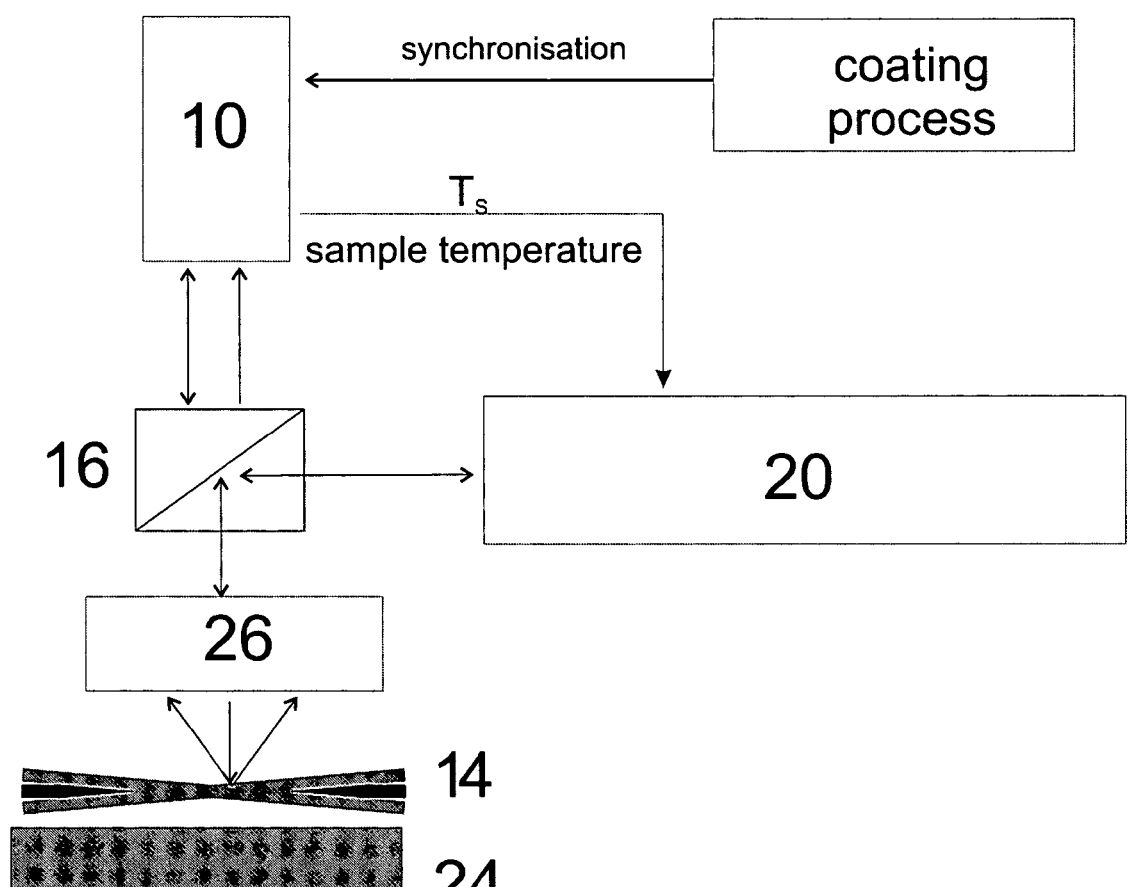
FIG. 1 a schematic representation of an apparatus in the scope of the invention, FIG. 2 a schematic representation of an apparatus in the scope of the invention with wobbling compensating mirror and two beam splitters, FIG. 3 a schematic representation of an apparatus in the scope of the invention with wobbling-compensating mirror and pyrometer detection that is rotated out of the plane of the spectral-optical measurement, FIG. 4 a schematic representation of an apparatus in the scope of the invention comprising lens, beam splitter and aperture for wobbling compensation at perpendicular light incidence and FIG. 5 a schematic representation of a sample carrier containing samples for the coating process.
Figure 2:
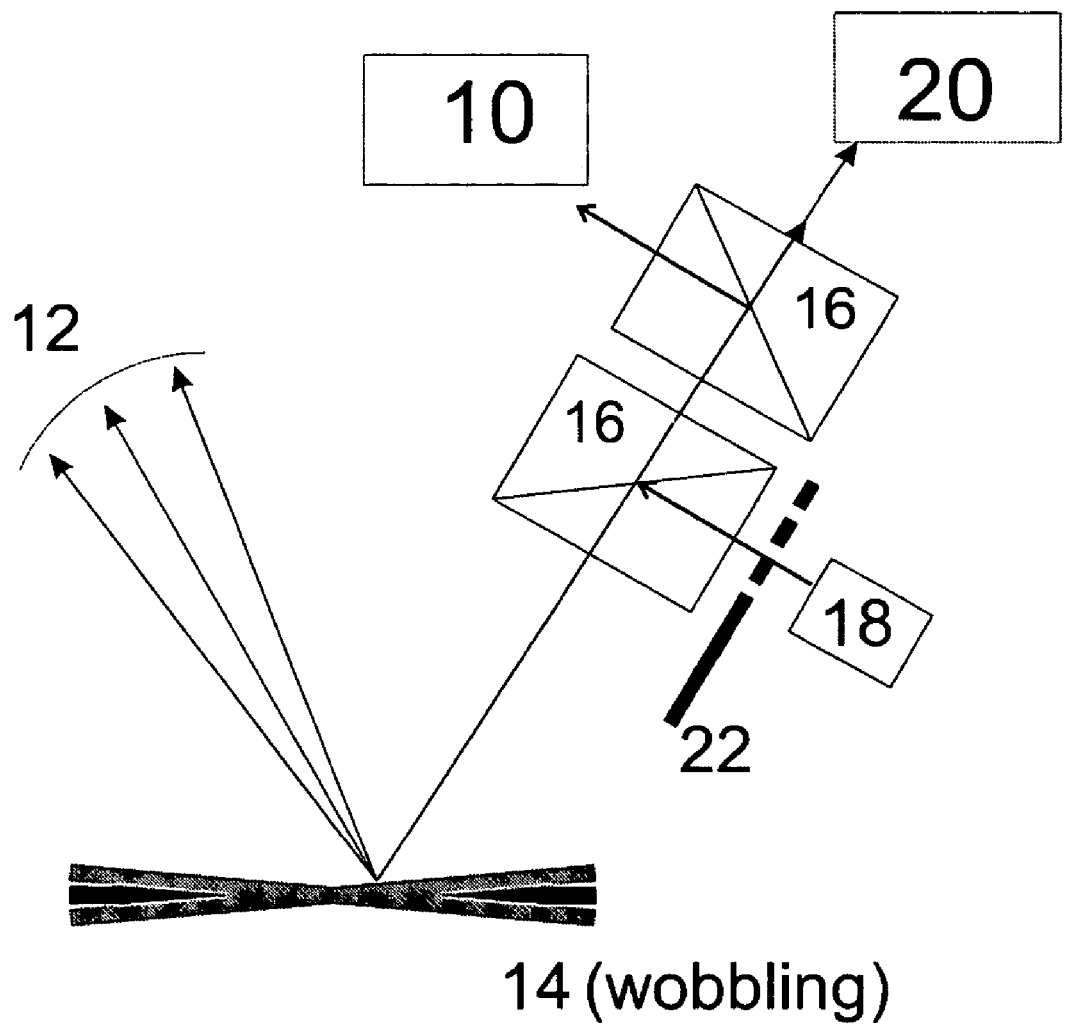
Figure 3:
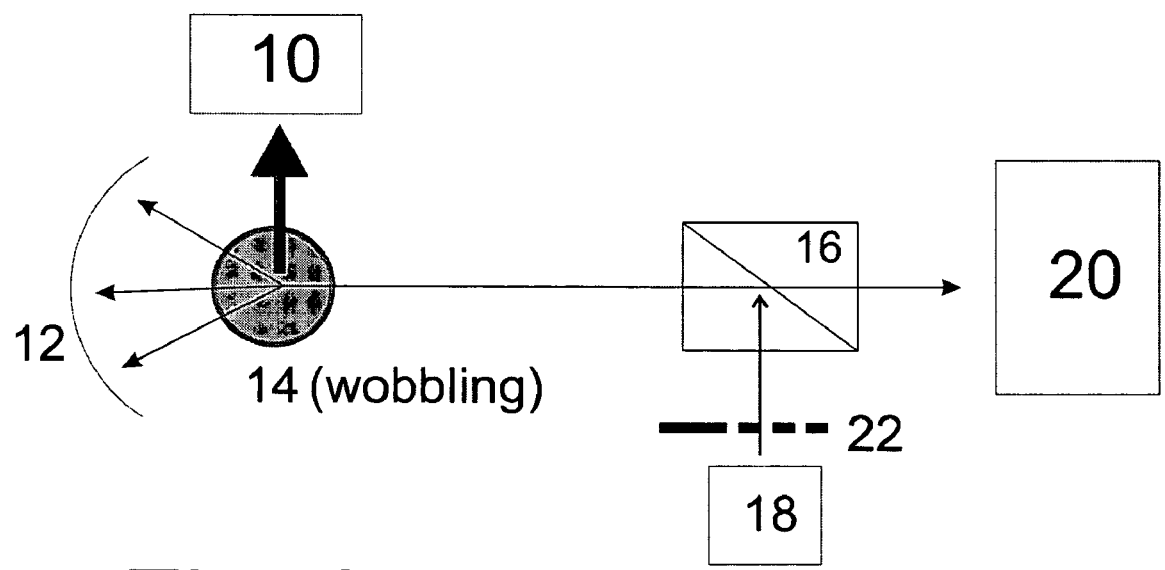
Figure 4:
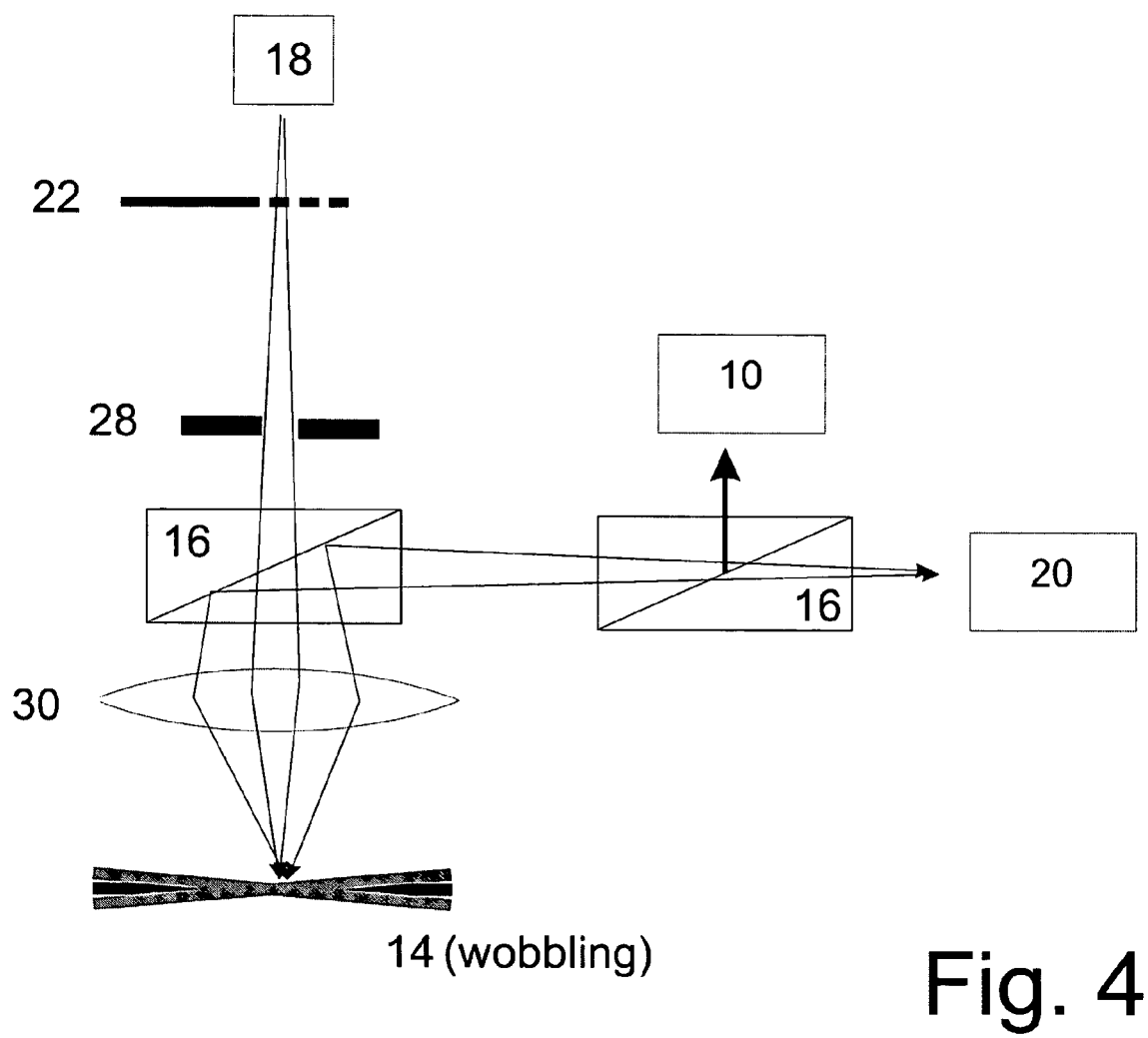

Referring now to the drawings, wherein like reference numerals designate identical or corresponding parts throughout the several views and more particular to FIG. 1 which shows a schematic representation of an apparatus in the scope of the invention. The emissivity corrected pyrometer 10 determines the sample temperature (Ts) of a wobbling (or otherwise non ideal reflecting) sample 14, that is mounted on the sample carrier 24. A suitable wobbling compensation optics 26 enables the prevention of an unwanted intensity drop during the measurement caused by a non ideal reflecting sample. Such an anti-wobbling-optics can be realised for oblique incidence of light by a spherical mirror 12 as shown in FIGS. 2 and 3. Therefore the mirror 12 and sample 14 have to be arranged in such a way, that the sample is located in the centre of the curvature of the spherical mirror 12. For a perpendicular incidence of light the anti-wobbling-optics can be implemented by an aperture 28, a lens 30 and a beam splitter 16, as shown in FIG. 4. The spectral-optical measurement 20 of layer parameters is connected with the pyrometer via an suitable arrangement in such a way, that on the one hand the measurement can be performed at the same time and at identical measurement conditions (for example same angle of incidence) and on the other hand the sample temperature ($T_P$) as measured by the pyrometer can be used immediately for the analysis of the spectral-optical measurement 20.

In this respect the pyrometer optical path and the optical path of the spectral-optical measurement are either separately guided or a measurement of the signal is made possible by blanking of the incident light in a such way that a complex signal separation according to the state of the art is omitted.

FIG. 2 shows a schematic representation of an apparatus in the spirit of the invention with wobbling-compensating mirror 12 and two beam splitters 16. This enables, by introduction of an effective emissivity <ε> (of the sample in interaction with the anti-wobbling-optic), that in addition to the spectral-optical measurement 20 and in spite of the intensity change due to the anti-wobbling-optics 12 a correct sample temperature ($T_P$) can be measured. When reflectance anisotropy spectroscopy is used, the separation of the pyrometer optical path and the optical path of the spectral-optical system is cause by a beam dividing polyarizing prism used as beam splitter 16. The spectral-optical measurement 20 of layer parameters is implemented in this embodiment by a reflectance anisotropy measurement or a spectral reflectance measurement. The complete arrangement incorporates spectral-optical measurement 20 and pyrometer 10 via an additional beam splitter. In a further embodiment this can be implemented by an arrangement, in which the pyrometric detection is rotated out of the plane of spectral-optical measurement 20, anti-wobbling-mirror 12, whereby the angle of incidence is identical, as shown in FIG. 3.

FIG. 4 shows a schematic representation of a device in the scope of the invention having lens, beam splitter and aperture for wobbling compensation at perpendicular incidence of light. For applications, where an exactly perpendicular incidence of light (respectively an exactly perpendicular detection) is necessary a wobbling-compensation-optic in the scope of the invention can be used that consists of the components lens 30, beam splitter 16, and aperture 28.

Figure 5:
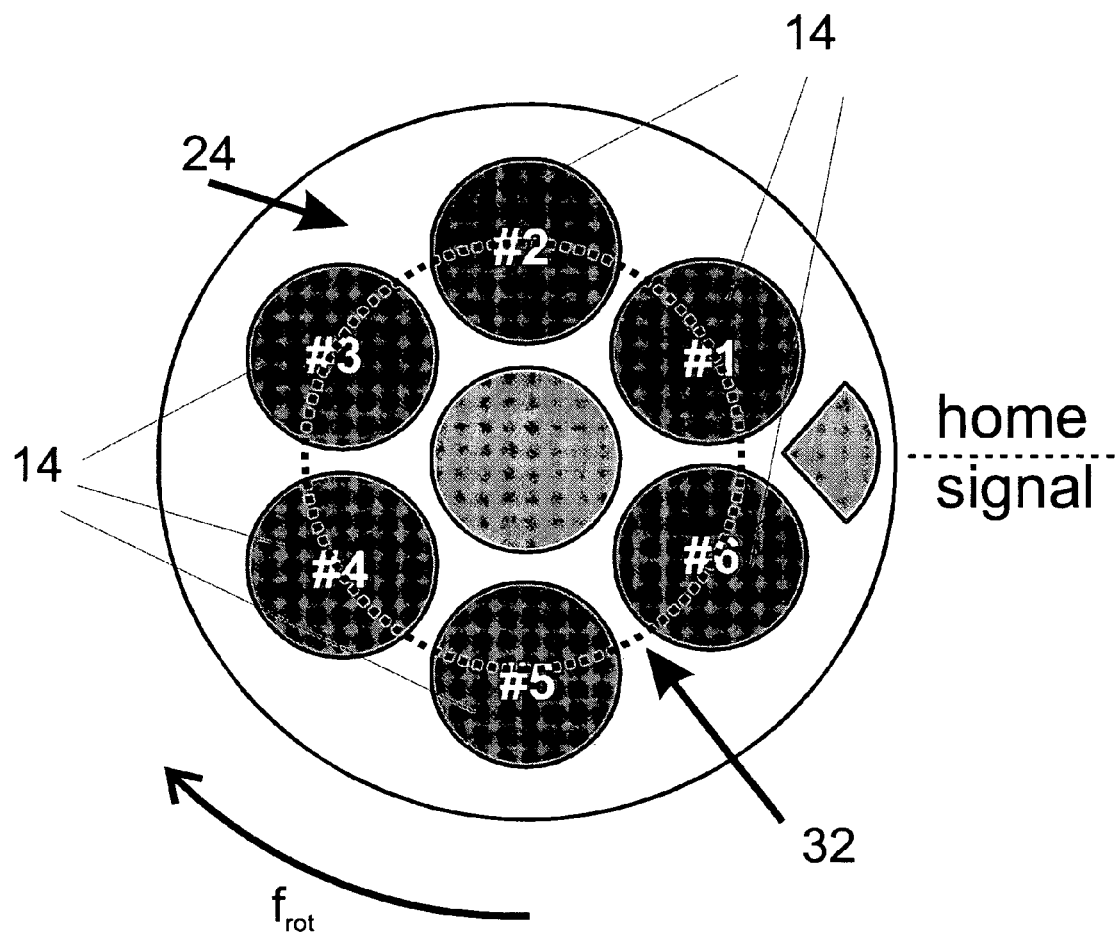

FIG. 5 shows a schematic representation of a sample carrier with samples mounted for the coating process. Even at a high rotation frequency of the sample carrier $f_{rot}$ the sample temperature can be measured exactly in the scope of the invention (resolved for each of the 6 samples and for the "bridge" of the sample carrier between the samples on the "measuring trace"), as long as the maximum detection frequency of the pyrometer detector stays $f_{pyro} > f_{rot}$. A modulation of the measuring light for the spectral-optical measurement can be omitted if the home-signal of the sample carrier is used in order to synchronise the blanking of the measuring light in a suitable way.

The invention is not limited to the here shown example embodiments. It is rather possible to implement additional embodiments by combination and modification of the mentioned means and features without leaving the scope of the invention.

Reference sign list

| | |
|---|---|
| 10 | pyrometer |
| 12 | anti-wobbling-mirror |
| 14 | sample |
| 16 | beam splitter |
| 18 | light source |
| 20 | spectral-optical measurement and analysis |
| 22 | shutter |
| 24 | sample carrier |
| 26 | anti-wobbling-optics |
| 28 | aperture |
| 30 | lens |
| 32 | measurement spots for pyrometer and spectral-optical measurement |

The invention claimed is:

1. A method for the determination of characteristic layer parameters comprising the steps of:
   irradiating light onto a layer structure;
   at least one emissivity-corrected pyrometer receiving emitted thermal radiation from said layer structure;
   determining the temperature of the layer by means of the at least one emissivity-corrected pyrometer;
   a spectral-optical system receiving reflected light from said layer structure;
   said spectral-optical system measuring the reflected light;
   determination of the characteristic layer parameters from said determination of temperature and said spectral-optical measurement,
   during said determination of characteristic layer parameters the wobbling and rotating of a sample is compensated by a lens, a beam splitter and an aperture.

2. The method according to claim 1,
   wherein the compensation of the wobbling and the rotating of the sample to be measured is implemented by a spherical mirror, where the sample is located in the centre of the curvature of the spherical mirror.

3. The method according to claim 1,
   further comprising a calculation of an effective emissivity <ε> of a sample carried out according to the formula $$<\epsilon> = (1-R_P)*(1+R_{ATS}*R_P) = \epsilon_P*(1+R_{ATS}*R_P)$$

where $R_P$ is the reflectance of the sample, $R_{ATS}$ the reflectance of the anti-wobbling-mirror and $\epsilon_P$ the emissivity of an absorbing sample without anti-wobbling-optics.

4. The method according to claim 1,
   further comprising a calculation of the effective emissivity <ε> of a transparent sample and transmissive measurement is carried out according to the formula:

$$<\epsilon> = \epsilon_{PT}*T_P*(1+R_{ATS}*R_P+R_{ATS}*T_P^2*R_{PT})$$

where $T_P$ is the transmission coefficient of the sample, $R_P$ is the reflectance of the sample, $R_{ATS}$ the reflectance of the anti-wobbling-mirror, $R_{PT}$ the reflectance of the sample holder and $\epsilon_{PT}$ the emissivity of the sample carrier.

5. The method according to claim 1,
wherein the spectral-optical measurement is carried out using only one wavelength.

6. A method for the determination of characteristic layer parameters comprising the steps of:
irradiating light onto layer structure;
at least one emissivity-corrected pyrometer receiving emitted thermal radiation from said layer structure;
determining the temperature of the layer by means of the at least one emissivity-corrected pyrometer;
a spectral-optical system receiving reflected light from said layer structure;
said spectral-optical system measuring the reflected light;
determination of the characteristic layer parameters from said determination of temperature and said spectral-optical measurement,
an optical path of said emitted thermal radiation to said at least one emissivity-corrected pyrometer and an optical path of said spectral-optical system being separated from each other.

7. The method according to claim 6,
wherein a the pyrometer optical path of the spectral-optical system are separated by a beam dividing polarizing prism when said spectral-optical measurement is reflectance anistropy spectroscopy.

8. The method according to claim 6,
wherein the pyrometer optical path is separated from the optical path of the spectral-optical measurement, where the angle of detection of the pyrometer with respect to the line perpendicular to the sample is identically equal to the angle of incidence of the spectral-optical measurement with respect to the line perpendicular to the sample.

9. A method for the determination of characteristic layer parameters comprising the steps of:
irradiating light onto a layer structure:
at least one emissivity-corrected pyrometer receiving emitted thermal radiation from said layer structure;
determining the temperature of the layer by means of the at least one emissivity-corrected pyrometer;
a spectral-optical system receiving reflected light from said layer structure;
said spectral-optical system measuring the reflected light;
determination of the characteristic layer parameters from said determination of temperature and said spectral-optical measurement,
separating reflected light for the spectral-optical measurement and emitted thermal radiation for the spectral-optical measurement by blanking the irradiated light.

10. The method according to claim 9,
wherein a separation of the thermal radiation for the temperature measurement and the reflected light for the spectral-optical measurement is implemented by synchronised blanking of the irradiated light with respect to the spectral-optical measurement.

11. The method according to claim 10,
wherein the blanking is implemented by means of a shutter.

12. The method according to claim 10,
wherein the synchronisation of the blanking takes place with respect to the rotation of a sample mounted on the sample carrier.

13. The method according to claim 12,
wherein additionally a measurement of the radial temperature profile of the sample carrier takes place.

14. An apparatus for the determination of characteristic layer parameters of a sample comprising:
a spectral-optical system receiving light from said sample;
at least one emissivity-corrected pyrometer receiving thermal radiation from said sample;
analysis means connected to said spectral-option system and said at least one emissivity-corrected pyrometer; and
means for compensation of the wobbling and the rotating of the sample including a spherical mirror for reflecting light from said sample to said spectral-optical system wherein the sample is located in the centre of the curvature of the spherical mirror.

15. The apparatus according to claim 14,
wherein the means for the compensation of the wobbling and the rotating of the sample comprises a lens, a beam splitter and an aperture.

16. The apparatus according to claim 14,
further comprises at least one beam splitter or at least one beam dividing polarizing prism.

* * * * *